United States Patent
Uchida et al.

(10) Patent No.: US 10,008,550 B2
(45) Date of Patent: Jun. 26, 2018

(54) DISPLAY

(71) Applicant: Sharp Kabushiki Kaisha, Sakai, Osaka (JP)

(72) Inventors: Hideki Uchida, Sakai (JP); Katsuhiro Kikuchi, Sakai (JP); Satoshi Inoue, Sakai (JP); Manabu Niboshi, Sakai (JP); Yoshiyuki Isomura, Sakai (JP); Yuto Tsukamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days. days.

(21) Appl. No.: 15/310,870

(22) PCT Filed: May 15, 2015

(86) PCT No.: PCT/JP2015/064001
§ 371 (c)(1),
(2) Date: Nov. 14, 2016

(87) PCT Pub. No.: WO2015/174515
PCT Pub. Date: Nov. 19, 2015

(65) Prior Publication Data
US 2017/0092701 A1    Mar. 30, 2017

(30) Foreign Application Priority Data
May 16, 2014 (JP) .................. 2014-102825

(51) Int. Cl.
*H01L 27/32*    (2006.01)
*H01L 51/52*    (2006.01)
*H01L 29/786*   (2006.01)

(52) U.S. Cl.
CPC ...... *H01L 27/3225* (2013.01); *H01L 27/3211* (2013.01); *H01L 51/5284* (2013.01);
(Continued)

(58) Field of Classification Search
None
See application file for complete search history.

(56) References Cited

U.S. PATENT DOCUMENTS

2007/0215888 A1   9/2007   Mitsuhashi
2014/0306869 A1   10/2014  Fujita et al.

FOREIGN PATENT DOCUMENTS

JP    2001-035655 A    2/2001
JP    2001-118676 A    4/2001
(Continued)

OTHER PUBLICATIONS

Official Communication issued in International Patent Application No. PCT/JP2015/064001, dated Aug. 4, 2015.

*Primary Examiner* — Fernando L Toledo
*Assistant Examiner* — Valerie N Newton
(74) *Attorney, Agent, or Firm* — Keating & Bennett, LLP

(57) ABSTRACT

A display according to an embodiment of the present invention includes an element substrate, a display section including a plurality of pixels each including a plurality of light-emitting elements, and monitoring elements for detecting the temperature of the light-emitting elements. The light-emitting elements each include an anode, a cathode, and a light-emitting layer placed between the anode and the cathode. The monitoring elements each include an anode, a cathode, and a light emission-suppressing layer containing the same light-emitting material as the light-emitting layer. When voltages are supplied to the monitoring elements, the light emission-suppressing layers do not emit any visible light or emit visible light with a luminance lower than the case where the same voltages as the above voltages are applied to the light-emitting elements.

17 Claims, 8 Drawing Sheets

(52) U.S. Cl.
   CPC ...... *H01L 27/3223* (2013.01); *H01L 27/3244* (2013.01); *H01L 27/3269* (2013.01); *H01L 29/7869* (2013.01); *H01L 2251/556* (2013.01)

(56) References Cited

FOREIGN PATENT DOCUMENTS

| | | |
|---|---|---|
| JP | 2002-333861 A | 11/2002 |
| JP | 2007-248702 A | 9/2007 |
| JP | 2008-181006 A | 8/2008 |
| WO | 2013/042626 A1 | 3/2013 |

DISPLAY

TECHNICAL FIELD

The present disclosure relates to a display.

This application claims priority based on Japanese Patent Application No. 2014-102825 filed on May 16, 2014, the entire contents of which are incorporated by reference herein.

BACKGROUND ART

For example, a self-luminous display such as an organic electro-luminescence display is known as a type of display. "Electro-luminescence" is hereinafter abbreviated to "EL". An organic EL display includes organic EL elements which are light-emitting sections and driving elements such as thin-film transistors controlling currents supplied to the light-emitting sections. "Thin-film transistor" is hereinafter abbreviated to "TFT".

In this type of organic EL display, it has been known that characteristics of the organic EL elements and characteristics of the driving elements are temperature-dependent and, in particular, the current-voltage characteristic (I-V characteristic) of each organic EL element is strongly temperature-dependent. Therefore, there is a problem in that even though a constant voltage is applied to the organic EL element, constant luminance is not obtained due to the temperature of an outside environment, the influence of heat generated from a device, or the like.

In order to solve the above problem, Patent Literature 1 discloses an "organic EL element" including a temperature-compensating element, such as a resistor, measuring the temperature of the organic EL element. Patent Literature 1 discloses that constant-current driving is performed by correcting the driving current on the basis of output results of the temperature-compensating element and the luminance is thereby maintained constant. Furthermore, Patent Literature 2 discloses a "display" which includes a light-emitting element serving as an element for temperature monitoring and which maintains the amount of a supplied current constant using temperature characteristics of the light-emitting element for monitoring.

CITATION LIST

Patent Literature

PTL 1: Japanese Unexamined Patent Application Publication No. 2001-118676

PTL 2: Japanese Unexamined Patent Application Publication No. 2002-333861

SUMMARY

Technical Problem

However, in the case where a light-emitting element is used for temperature monitoring as described in Patent Literature 2, light is emitted from the light-emitting element for temperature monitoring. The light-emitting element for temperature monitoring is placed separately from a light-emitting element in a pixel section. Therefore, when the light-emitting element for temperature monitoring emits light, color mixing occurs due to light emitted from the light-emitting element in the pixel section, thereby causing a problem that display quality is reduced. In order to avoid this problem, the following method is conceivable: a method in which the temperature is monitored while the luminance of the pixel section is high such that light emitted from the light-emitting element for temperature monitoring is not conspicuous. However, in this method, the timing that the temperature is monitored is limited to a specific period. In this case, the temperature cannot be monitored with arbitrary timing and therefore it is difficult to adjust the luminance of the pixel section.

One embodiment of the present invention has been made to solve the above problem and has an object to provide a display capable of minimizing the influence on display quality and capable of appropriately controlling the luminance of a pixel section by temperature correction.

Solution to Problem

In order to achieve the above object, a display according to one embodiment of the present invention includes a base member; a display section, attached to the base member, including a plurality of pixels each including a plurality of light-emitting elements; and detection elements, attached to the base member, for detecting the temperature of the light-emitting elements. The light-emitting elements each include a light-emitting element first electrode, a light-emitting element second electrode, and a light-emitting layer placed between the light-emitting element first electrode and the light-emitting element second electrode. The detection elements each include a detection element first electrode, a detection element second electrode, and a light emission-suppressing layer containing the same light-emitting material as the light-emitting layer, the light emission-suppressing layer being placed between the detection element first electrode and the detection element second electrode. When voltages are supplied to the detection elements, the light emission-suppressing layers do not emit any visible light or emit visible light with a luminance lower than the case where the same voltages as the above voltages are applied to the light-emitting elements.

The display according to one embodiment of the present invention may further include a control section controlling voltages supplied to the light-emitting elements on the basis of results detected by the detection elements.

In the display according to one embodiment of the present invention, the light emission-suppressing layers may contain an organic light-emitting material emitting visible light and a quenching material.

In the display according to one embodiment of the present invention, the light emission-suppressing layers may have a single-layer structure containing a mixture of the organic light-emitting material and the quenching material.

In the display according to one embodiment of the present invention, the light emission-suppressing layers may have a multilayer structure including a layer containing the organic light-emitting material and a layer containing the quenching material.

In the display according to one embodiment of the present invention, the quenching material may include a metal material.

In the display according to one embodiment of the present invention, the quenching material may include an organic material having an absorption wavelength range having at least one portion overlapping the emission wavelength range of the organic light-emitting material.

In the display according to one embodiment of the present invention, the light emission-suppressing layers may contain an organic light-emitting material emitting visible light and an invisible light-emitting material having at least one emission peak wavelength in an invisible range.

In the display according to one embodiment of the present invention, the invisible range may be a wavelength range of more than 780 nm.

In the display according to one embodiment of the present invention, the detection elements may be placed outside the display section.

In the display according to one embodiment of the present invention, each of the pixels in the display section may be provided with a corresponding one of the detection elements.

In the display according to one embodiment of the present invention, the size of the detection elements may be less than the size of the light-emitting elements.

In the display according to one embodiment of the present invention, each of the pixels may include a plurality of sub-pixels emitting light of different colors and the detection elements may be each composed of a plurality of detection elements corresponding to the different colors.

In the display according to one embodiment of the present invention, the pixels may be provided with thin-film transistors and the thin-film transistors may each include a semiconductor layer made of an oxide semiconductor.

Advantageous Effects of Invention

According to an embodiment of the present invention, the following display can be provided: a display capable of minimizing the influence on display quality and capable of appropriately controlling the luminance of a pixel section by temperature correction.

DESCRIPTION OF EMBODIMENTS

[First Embodiment]

A first embodiment of the present invention is described below with reference to FIGS. 1 to 5.

An organic EL display according to the first embodiment is an example of a top emission-type organic EL display having a microcavity structure.

In order to provide a clear understanding of components in drawings below, the components are shown at different scales in some cases.

Figure 1:
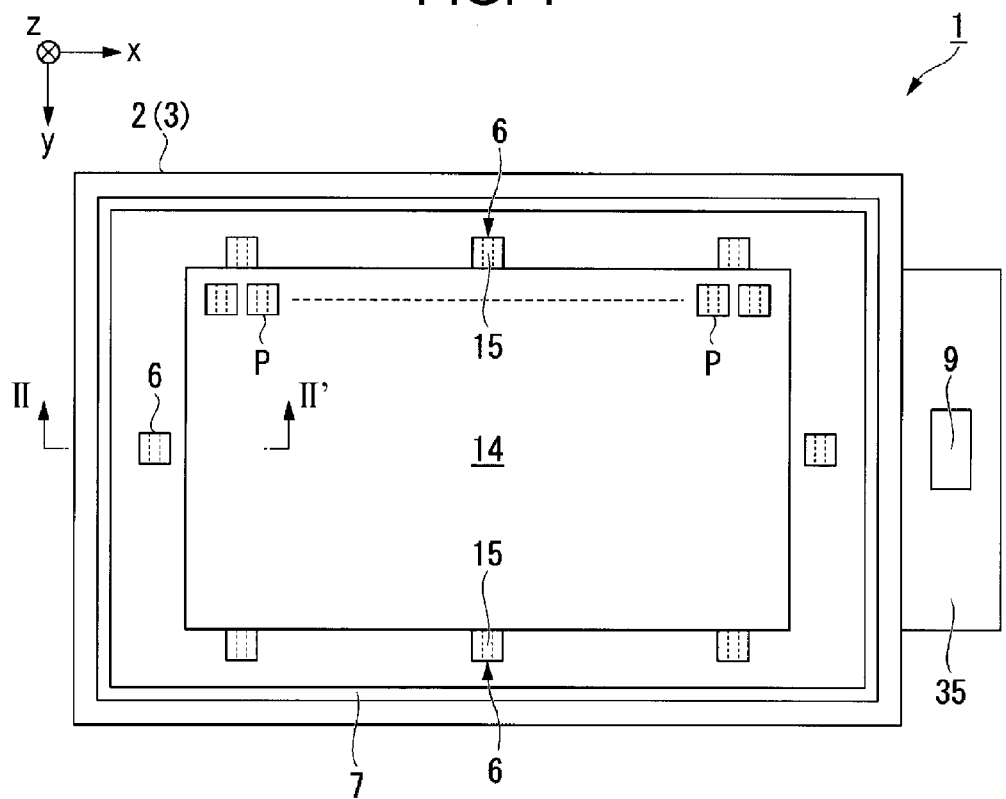
FIG. 1 is a plan view showing an organic EL display according to a first embodiment of the present invention.
Figure 2:
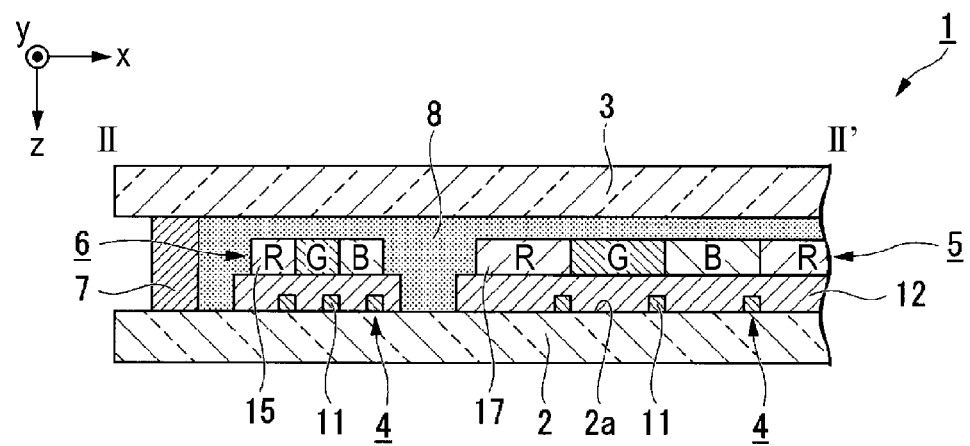
FIG. 2 is a sectional view taken along the line II-II' of FIG. 1.

As shown in FIGS. 1 and 2, the organic EL display 1 according to this embodiment includes an element substrate 2, a sealing substrate 3, TFT sections 4, light-emitting element sections 5, monitoring element sections 6, a sealing member 7, a filler 8, and a controlling semiconductor element 9. The element substrate 2 and the sealing substrate 3 are rectangular and have substantially the same size. The element substrate 2 and the sealing substrate 3 are each composed of, for example, a glass substrate with a thickness of 0.5 mm. The element substrate 2 and the sealing substrate 3 are placed opposite to each other.

The element substrate 2 in this embodiment corresponds to a base member specified in the claims.

The sealing member 7 extends along a rectangular periphery following the outline of each of the element substrate 2 and the sealing substrate 3 to form a rectangular loop. The sealing member 7 is one for bonding the element substrate 2 and the sealing substrate 3 together with a predetermined distance therebetween. The sealing member 7 is made of, for example, a resin material.

The TFT sections 4, the light-emitting element sections 5, and the monitoring element sections 6 are placed on or above a first surface 2a of the element substrate 2 that faces the sealing substrate 3. Each TFT section 4 includes TFTs 11 and wiring lines (not shown) such as gate lines supplying signals to the TFTs 11, data lines, and power supply lines. The upper side of each TFT 11 is covered with an interlayer insulating film 12.

For example, an oxide semiconductor (In—Ga—Zn—O semiconductor) containing indium (In), gallium (Ga), zinc (Zn), and oxygen (O) can be used as a material for a semiconductor layer making up the TFT 11. The material for the semiconductor layer is not limited to the oxide semiconductor, such as an In—Ga—Zn—O semiconductor, and may be, for example, a silicon semiconductor such as CGS (continuous grain silicon), LPS (low-temperature poly-silicon), or α-Si (amorphous silicon).

From viewpoints below, the oxide semiconductor, such as an In—Ga—Zn—O semiconductor, is preferably used as the material for the semiconductor layer. The oxide semiconductor has a mobility higher than that of α-Si. Therefore, TFTs using the oxide semiconductor can operate at higher speed as compared to TFTs using α-Si. A layer of the oxide semiconductor can be formed by a more simple process as compared to a layer of poly-silicon and therefore is applicable to devices required to have a large area.

The oxide semiconductor layer can be formed by, for example, a procedure below.

First, an oxide semiconductor film with a thickness of 30 nm to 300 nm is formed on an insulating film by a sputtering process. Next, a resist mask is formed by photolithography so as to cover a predetermined region of the oxide semiconductor film. Next, a portion of the oxide semiconductor film that is not covered by the resist mask is removed by wet etching. Thereafter, the resist mask is peeled off. This allows the oxide semiconductor layer to be obtained.

In addition to the In—Ga—Zn—O semiconductor, the following compounds can be used as the oxide semiconductor: for example, IZO (In—Zn—O semiconductor) that is an oxide composed of indium and zinc, ZTO (Zn—Ti—O) semiconductor)that is an oxide composed of zinc and titanium), and the like.

As shown in FIG. 2, the light-emitting element sections 5 and the monitoring element sections 6 are placed on the interlayer insulating film 12. The detailed configuration of each of the light-emitting element sections 5 and the monitoring element sections 6 is described below. A spaced surrounded by the element substrate 2, the sealing substrate 3, and the sealing member 7 is filled with the filler 8. The filler 8 is made of, for example, an organic material with a refractive index of 1.5.

As shown in FIG. 1, a display section 14 is placed inside a region surrounded by the sealing member 7. The display section 14 is a region in which a plurality of pixels P are arranged in a matrix pattern and in which an arbitrary image, a letter, or the like is displayed with the pixels P. Each of the pixels P, which make up the display section 14, has a configuration in which three sub-pixels including a red (R) sub-pixel, a green (G) sub-pixel, and a blue (B) sub-pixel are placed. For example, the organic EL display 1 has a size of 7.4 inches and a display resolution of 300 ppi. The display section 14 has a size of 163 mm×92 mm, the number of the pixels in a horizontal direction is 1,920, and the number of the pixels in a vertical direction is 1,080. Each pixel P has a size of 85 μm×85 μm. Each sub-pixel has a size of 85 μm×28 μm.

The monitoring element sections 6 each include a plurality of monitoring element sections placed outside the display section 14. In this embodiment, the number of the monitoring element sections 6 used is eight. Three of the eight monitoring element sections 6 are placed in a region along each side of the display section 14 that extends in a horizontal direction (x-axis direction) and one is placed in a region along each side of the display section 14 that extends in a vertical direction (y-axis direction). The number of the monitoring element sections 6 is not limited to eight and may be arbitrary. The arrangement of the monitoring element sections 6 is not limited to the above-mentioned arrangement and may be arbitrary. Each of the monitoring element sections 6 includes three monitoring elements 15 corresponding to three R, G, and B sub-pixels making up a corresponding one of the pixels P in the display section 14.

The monitoring elements 15 in this embodiment correspond to detection elements specified in the claims.

Figure 3A:
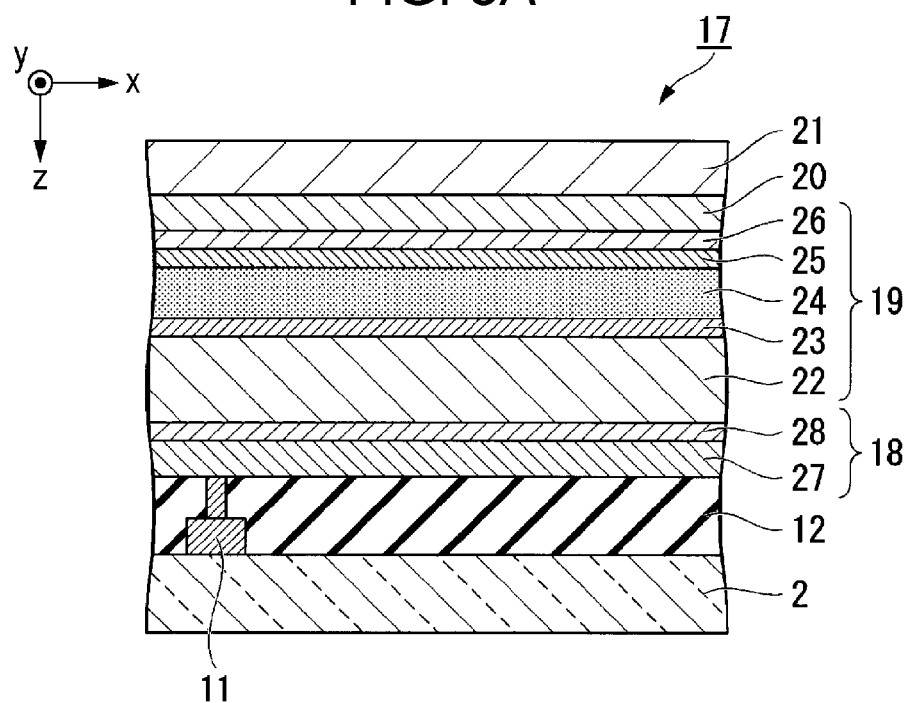
FIG. 3A is a sectional view showing a light-emitting element.

As shown in FIG. 3A, each light-emitting element 17 includes an anode 18, an organic layer 19, a cathode 20, and a capping layer 21. The anode 18 is placed on the interlayer insulating film 12 on the first surface 2a of the element substrate 2. The anode 18 is composed of a metal film 27 made of aluminium or the like and a transparent conductive film 28 made of IZO or the like.

The anode 18 in this embodiment corresponds to a light-emitting element first electrode specified in the claims. The cathode 20 in this embodiment corresponds to a light-emitting element second electrode specified in the claims.

The organic layer 19 is placed on the anode 18 above the first surface 2a of the element substrate 2. The organic layer 19 is composed of a multilayer film in which a hole injection layer 22, a hole transport layer 23, a light-emitting layer 24, an electron transport layer 25, and an electron injection layer 26 are stacked from the element substrate 2 side. The cathode 20 is placed on the organic layer 19 above the first surface 2a of the element substrate 2. In this embodiment, a region between the anode 18 and the cathode 20 makes up a microcavity structure. Light emitted from the light-emitting layer 23 is multiply reflected between the anode 18 and the cathode 20.

For example, a glass substrate is used to make up the element substrate 2. Since the organic EL display 1 according to this embodiment is a top emission-type organic EL display, the element substrate 2 need not necessarily be a transparent substrate. In the first surface 2a of the element substrate 2, each of the sub-pixels SP is provided with a corresponding one of the TFTs 11. Furthermore, a data line for supplying a signal to each TFT 11, a scanning line, a power supply line (not shown), and the like are placed on the first surface 2a of the element substrate 2. The interlayer insulating film 12 is placed on first surface 2a of the element substrate 2 so as to cover the TFT 11, the data line, the scanning line, the power supply line, and the like. For example, a resin film such as an acrylic resin or an inorganic film such as a silicon oxide film is used as a material for the interlayer insulating film 12.

The anode 18 is placed on the interlayer insulating film 12. The anode 18 includes, for example, a multilayer film composed of the metal film 27, made of aluminium (Al), silver (Ag), or the like, having high reflectance and the transparent conductive film 28 made of indium tin oxide (ITO), indium zinc oxide (IZO), or the like. The anode 18 has a function of injecting holes into the organic layer 19. For the thickness of the anode 18, the thickness of the metal film 27 is, for example, about 100 nm and the thickness of the transparent conductive film 28 is about 20 nm.

The organic layer 19 includes the hole injection layer 22, the hole transport layer 23, the light-emitting layer 24, the electron transport layer 25, and the electron injection layer 26. Those other than the light-emitting layer 13 may be appropriately interposed as required. A transport layer and an injection layer may be combined into one and an inorganic film may be used.

This embodiment exemplifies that the organic layer 19 has a five-layer structure consisting of the hole injection layer 22, the hole transport layer 23, the light-emitting layer 24, the electron transport layer 25, and the electron injection layer 26 as described above. Furthermore, the following layer may be appropriately added as required: a layer, such as a hole-blocking layer or an electron-blocking layer, for preventing the migration of charges toward an opposite side electrode.

The organic layer 19 is formed by a known process. For example, a pattern may be formed by a vacuum vapor deposition process using a shadow mask. Besides this, a spraying process, an inkjet process, a printing process, a laser transfer process, and the like can be used.

The hole injection layer 22 is a layer having a function of increasing the efficiency of injecting holes into the light-emitting layer 24 from the anode 18. The following material is used as a material for the hole injection layer 22: for example, benzin, styrylamine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, a derivative thereof, a polysilane compound, or a heterocyclic conjugated monomer, oligomer, or polymer such as a vinylcarbazole compound, a thiophene compound, or a aniline compound. The organic material is mixed with a molybdenum oxide. The mixing ratio of the organic material to the molybdenum oxide is as follows: for example, the organic material is about 80% and the molybdenum oxide is about 20%.

The hole transport layer 23 is a layer having a function of increasing the efficiency of transporting holes from the anode 18 to the light-emitting layer 24. An organic material similar to the hole injection layer 22 is used in the hole transport layer 23. The hole injection layer 22 and the hole transport layer 23 may be combined into one or may be formed in the form of independent layers.

The light-emitting layer 24 is placed between the anode 18 and the cathode 20. The light-emitting layer 24 has a function of recombining holes injected from the anode 18 with electrons injected from the cathode 20 to emit light when energy is lost. A material for the light-emitting layer 24 is composed of, for example, a host material and a dopant material. The light-emitting layer 24 may further contain an assist material. The content of the host material in the light-emitting layer 24 is highest among constituent materials in the light-emitting layer 24. The mixing ratio of the host material to the dopant material is as follows: for example, the host material is about 90% and the dopant material is about 10%.

The host material has a function of facilitating the formation of the light-emitting layer 24 and a function of keeping the light-emitting layer 24 filmy. Thus, the host material needs to be a stable compound which is unlikely to be crystallized after film formation and which is unlikely to be chemically changed. Furthermore, the host material has a function of causing the dopant material to emit light in such a manner that carriers are recombined in host molecules and the excitation energy thereof is transferred to the dopant material when an electric field is applied between a pair of electrodes. The thickness of the light-emitting layer 24 is, for example, about 60 nm.

Materials, such as low-molecular-weight dyes, fluorescent polymers, and metal complexes, having high luminous efficiency are cited as a specific material for the light-emitting layer 24. Examples of a material for the light-emitting layer 24 include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, derivatives thereof, a tris(8-quinolinolato) aluminum complex, a bis(benzoquinolinolato) beryllium complex, a tri(dibenzoylmethyl) phenanthroline europium complex, and ditolylvinyl biphenyl.

The electron transport layer 25 has a function of increasing the efficiency of transporting electrons from the cathode 20 to the light-emitting layer 24.

The following material is used as a material for the electron transport layer 25: for example, quinoline, perylene, phenanthroline, bisstyryl, pyrazine, triazole, oxazole, oxadiazole, fluorenone, a derivative thereof, or a metal complex thereof. In particular, the following material is used: tris(8-hydroxyquinoline) aluminum, anthracene, naphthalene, phenanthrene, pyrene, stilbene, 1,10-phenanthroline, a derivative thereof, a metal complex thereof, or the like. The thickness of the electron transport layer 25 is, for example, about 15 nm.

The electron injection layer 26 has a function of increasing the efficiency of injecting electrons into the light-emitting layer 24 from the cathode 20.

For example, metallic calcium (Ca), lithium fluoride (LiF), or the like is used as a material for the electron injection layer 26. The electron transport layer 25 and the electron injection layer 26 may be combined into one or may be formed in the form of independent layers. The thickness of the electron injection layer 26 is, for example, about 0.5 nm.

The cathode 20 has a function of injecting electrons into the organic layer 19. In the cathode 20, a metal with a low-work function or the like is preferably used. For example, Ag, Al, a magnesium alloy (MgAg or the like), an aluminium alloy (AlLi, AlCa, AlMg, or the like), or the like is used. The thickness of the cathode 20 is appropriately adjusted for the purpose of achieving the property of partially transmitting and reflecting light, that is, so-called transflectivity. The thickness of the cathode 20 is as follows: for example, in the case of an MgAg/Ag multilayer film, MgAg is about 1 nm and Ag is about 20 nm.

The organic EL display 1 according to this embodiment has the microcavity structure and exemplifies a top emission type in which light is extracted from the side opposite to the element substrate 2. Besides this, the organic EL display 1 may be a bottom emission type in which light is extracted from the element substrate 2 side.

The microcavity structure exploits the resonance of light between the anode 18 and the cathode 20 and has the effect of increasing the intensity of light with a specific wavelength. In this embodiment, light emitted from the R, G, and B sub-pixels has different wavelengths and therefore the optical path length between the anode 18 and the cathode 20 corresponds to the peak wavelength of the emission spectrum of each color. Thus, optical path lengths are set such that the optical path length of the red sub-pixels is largest, the optical path length of the blue sub-pixels is smallest, and the optical path length of the green sub-pixels is intermediate therebetween.

There are various techniques for allowing the microcavity structures of the sub-pixels to have different optical path lengths. Herein, from the viewpoint of minimizing the influence on the resistance, a technique for allowing the hole injection layers 22 to have different thicknesses. That is, supposing that the thickness of the hole injection layers 22 of the red sub-pixels is tHILR, the thickness of the hole injection layers 22 of the green sub-pixels is tHILG, and the thickness of the hole injection layers 22 of the blue sub-pixels is tHILB, tHILR>tHILG>tHILB holds.

This allows light emitted from the organic layer 19 to be repeatedly reflected between the anode 18 and the cathode 20 within the range of a predetermined optical path length, whereby light with a predetermined wavelength corresponding to the optical path length is amplified by resonance and light with a wavelength not corresponding to the optical path length is attenuated. As a result, the spectrum of light extracted outside is sharp and is intense, leading to an increase in luminance and color purity.

For constituent materials of the light-emitting layer 24, a light-emitting material emitting red light may be used in the red sub-pixels, a light-emitting material emitting green light may be used in the green sub-pixels, and a light-emitting material emitting blue light may be used in the blue sub-pixels. In the case of this embodiment, for the host material, a bipolar material is used in all of the red sub-pixels, the green sub-pixels, and the blue sub-pixels.

For the dopant material, a phosphorescent material is used in the red sub-pixels and the green sub-pixels and a fluorescent material is used in the blue sub-pixels. The thickness of the light-emitting layer 24 of each of the red sub-pixels and the green sub-pixels is, for example, about 60 nm. The thickness of the light-emitting layer 24 of each of the blue sub-pixels is, for example, about 35 nm.

Alternatively, the same light-emitting material emitting white light may be used in all of the red sub-pixels, the green sub-pixels, and the blue sub-pixels. Even in this case, light with different wavelengths is amplified by resonance depending on the sub-pixels, resulting in that red light is emitted from the red sub-pixels, green light is emitted from the green sub-pixels, and blue light is emitted from the blue sub-pixels.

A detailed example of the configuration of each light-emitting element 17 is as shown in, for example, [Table 1].

In particular, the constituent materials of the light-emitting layer 24 are as follows: in all the sub-pixels, the host material is 90% and the dopant material is 10%. The thickness of the light-emitting layers 24 of the red and green sub-pixels is 60 nm and thickness of the light-emitting layers 24 of the blue sub-pixels is 35 nm. In contrast, materials of the light emission-suppressing layer 30 are as follows: in all the sub-pixels, the host material is 85%, the dopant material is 9%, and the quenching material, which is made of aluminium, is 6%. The thickness of the light emission-

TABLE 1

|  | Red sub-pixel | Green sub-pixel | Blue sub-pixel |
|---|---|---|---|
| Anode | Al 100 nm/IZO 20 nm | Al 100 nm/IZO 20 nm | Al 100 nm/IZO 20 nm |
| Hole injection layer | Organic HTL material (80%):MoOx (20%) 230 nm | Organic HTL material (80%):MoOx (20%) 170 nm | Organic HTL material (80%):MoOx (20%) 135 nm |
| Hole transport layer | Organic HTL material 10 | Organic HTL material 10 | Organic HTL material 10 |
| Light-emitting layer | H (90%):d (10%) 60 nm H:bipolar material d:phosphorescent material Light-emitting position:center of light-emitting layer | H (90%):d (10%) 60 nm H:bipolar material d:phosphorescent material Light-emitting position:center of light-emitting layer | H (90%):d (10%) 35 nm H:bipolar material d:phosphorescent material Light-emitting position:center of light-emitting layer |
| Electron transport layer | Organic ETL material 15 nm | Organic ETL material 15 nm | Organic ETL material 15 nm |
| Electron injection layer | LiF 0.5 nm | LiF 0.5 nm | LiF 0.5 nm |
| Cathode | MgAg 1 nm/Ag 24 nm | MgAg 1 nm/Ag 24 nm | MgAg 1 nm/Ag 24 nm |
| Capping layer | 78 nm | 78 nm | 78 nm |

EML H (host material), A (assist material), d (dopant material)

Figure 3B:
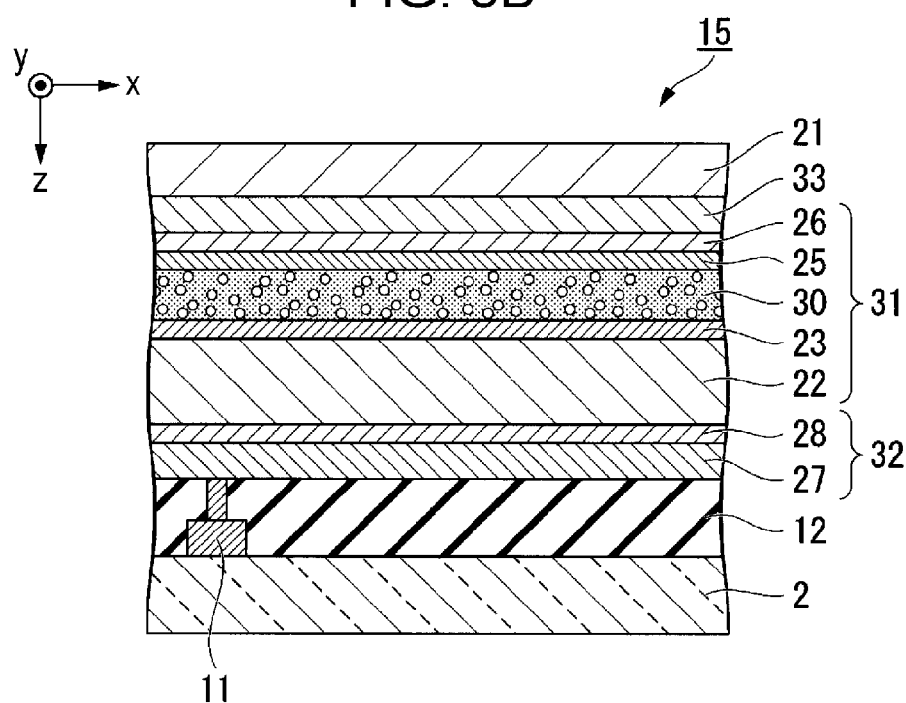
FIG. 3B is a sectional view showing a detection element.

As shown in FIG. 3B, each monitoring element 15 includes an anode 32, an organic layer 31, a cathode 33, and a capping layer 21. The organic layer 31 is composed of a multilayer film in which a hole injection layer 22, a hole transport layer 23, a light emission-suppressing layer 30, an electron transport layer 25, and an electron injection layer 26 are stacked from the element substrate 2 side. The size of the monitoring element 15 is less than the size of each light-emitting element 17 in the plane of a substrate and is, for example, 10 μm×10 μm.

The anode 32 in this embodiment corresponds to a first electrode, specified in the claims, for detection elements. The cathode 33 in this embodiment corresponds to a second electrode, specified in the claims, for detection elements.

Constituent materials and the thickness of the anode 32 and cathode 33 of the monitoring element 15 are the same as the constituent materials and thickness of the anode 18 and cathode 20 of the light-emitting elements 17. Constituent materials and the thickness of the four layers (the hole injection layer 22, the hole transport layer 23, the electron transport layer 25, and the electron injection layer 26), other than the light emission-suppressing layer 30, in the organic layer 31 are the same as the constituent materials and thickness of corresponding layers in the light-emitting element 17. Although the light emission-suppressing layer 30 is basically similar to the light-emitting layer 24 of the light-emitting element 17, the light emission-suppressing layer 30 is different from the light-emitting layer 24 in that the constituent materials of the light-emitting layer 24 are laced with a quenching material.

That is, the light emission-suppressing layer 30 contains the same light-emitting material as that in the light-emitting layer 24.

suppressing layers 30 in all the monitoring elements is the same as the thickness of the light-emitting layers 24. That is, in the light emission-suppressing layers 30, aluminium as the quenching material is added to the constituent materials of the light-emitting layers 24. The light emission-suppressing layers 30 can be formed by co-depositing the host material, the dopant material, and the quenching material.

A detailed example of the configuration of each light emission-suppressing layer 30 is as shown in, for example, [Table 2].

TABLE 2

|  | Red | Green | Blue |
|---|---|---|---|
| Light emission-suppressing layer | H (85%):d (9%) + Al (6%) 60 nm | H (85%):d (9%) + Al (6%) 60 nm | H (85%):d (9%) + Al (6%) 35 nm |

As shown in FIG. 1, the element substrate 2 is connected to a mounting board 35. The controlling semiconductor element 9 is mounted on the mounting board 35 so as to control the voltage supplied to the light-emitting element sections 5 through the TFT sections 4. The controlling semiconductor element 9 controls the voltage supplied to the light-emitting element sections 5 on the basis of temperature detection results obtained by the monitoring elements.

The controlling semiconductor element 9 in this embodiment corresponds to a control section specified in the claims.

The organic EL display 1 according to this embodiment includes the light emission-suppressing layers 30, which are basically the same in cross-sectional structure and material as the light-emitting elements 17 and in which a metal quenching material is added to a light-emitting material, as the monitoring elements 15, which are used to monitor the temperature of the light-emitting elements 17. In the case where the metal quenching material is added to the light-emitting material, excitons generated in the light-emitting material are incorporated in the continuum level of metal, are quenched, and therefore cannot emit light. Thus, the monitoring elements 15 emit no light; hence, color mixing due to light emitted from the light-emitting elements 17 of the display section 14 does not occur or display quality is not reduced. Accordingly, in accordance with the organic EL display 1 according to this embodiment, the temperature can be monitored with arbitrary timing and therefore the luminance of the display section 14 can be appropriately adjusted.

Furthermore, in this embodiment, a metal such as aluminium is used as the quenching material and therefore the effect of converting energy that should be basically used to emit light into heat energy occurs. However, since the monitoring elements 15 have a size sufficiently less than that of the pixels P and are in contact with the element substrate 2, heat generated from the monitoring elements 15 is dissipated through the element substrate 2 without being accumulated in the element substrate 2. As a result, the temperature of the monitoring elements 15 is not increased and the I-V characteristic can be accurately monitored. Incidentally, the content of the metal quenching material in the light emission-suppressing layer 30 is slight and therefore the influence on the I-V characteristic is slight.

For example, gold (Au), silver (Ag), copper (Cu), and the like are cited as the metal quenching material in addition to aluminium. When a metal material is adjacent to a fluorescent material, energy transfers from the fluorescent material to the metal. Therefore, the type of the metal is not limited and the metal can be used as the quenching material. Metal materials have different activities depending on material. Therefore, a stable material with low activity is preferably used for the purpose of avoiding negative influences other than quenching. In particular, Al, Au, or the like is preferably used.

In order to verify effects of the embodiment of the invention, the inventors have demonstrated effects of the organic EL display 1 according to this embodiment using an organic EL display including a light-emitting element and a monitoring element which contains no quenching material and which is exactly the same as the light-emitting element as a comparative example.

Figure 4:
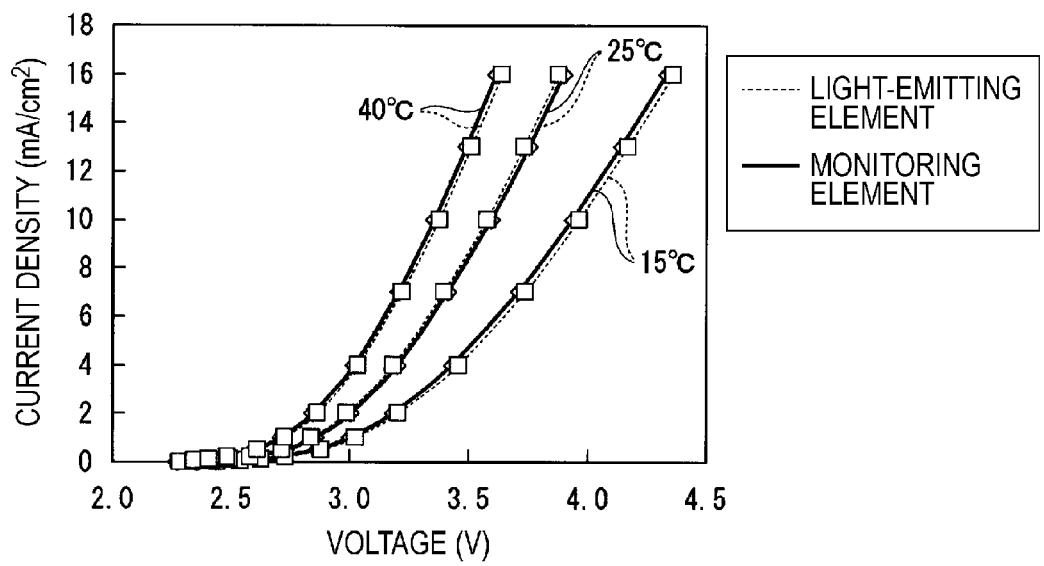
FIG. 4 is a graph showing the temperature dependence of the I-V characteristic of each of a light-emitting element and a monitoring element.

FIG. 4 is a graph showing the temperature dependence of the I-V characteristic of each of the light-emitting element and the monitoring element. In FIG. 4, the horizontal axis represents the voltage [V] and the vertical axis represents the current density [mA/cm$^2$]. The I-V characteristic at a temperature of 15° C., the I-V characteristic at a temperature of 25° C., and the I-V characteristic at a temperature of 40° C. are shown. In this embodiment, three types of monitoring elements corresponding to the red, green, and blue sub-pixels are used and the tendency of the temperature dependence of the I-V characteristic does not vary between the three types of monitoring elements. Thus, herein, an example of a monitoring element corresponding to a green sub-pixel is cited.

As shown in FIG. 4, it is clear that the I-V characteristic varies significantly depending on temperature. Furthermore, it is clear that there is little difference between the I-V characteristic of the light-emitting element and the I-V characteristic of the monitoring element. This shows that the process that excitons are generated and are then quenched by a quenching material is reproduced well and also shows that the area of the monitoring element is small, heat generated from the quenching material is dissipated, and the temperature hardly increases.

Figure 5:
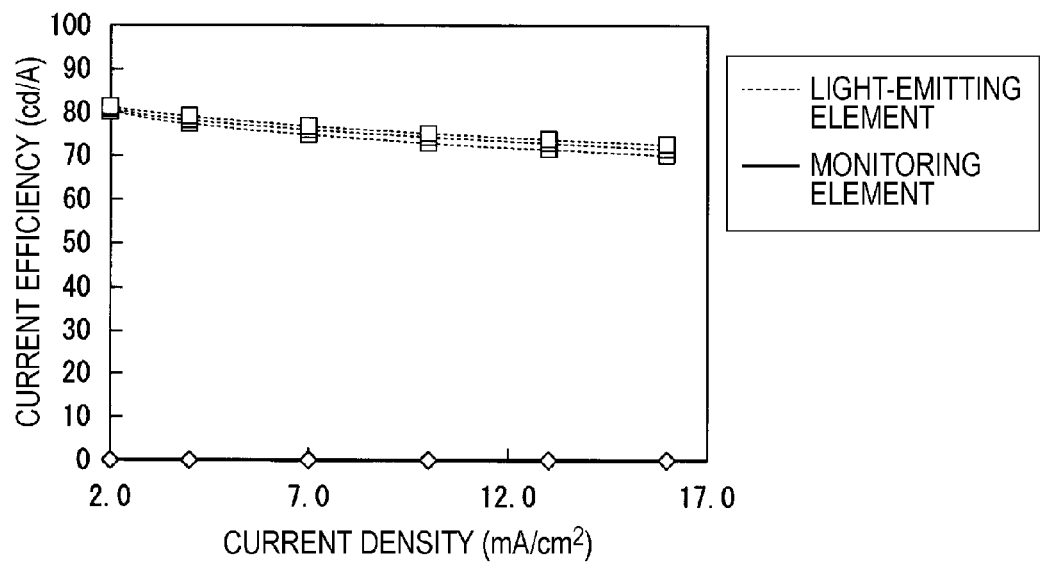
FIG. 5 is a graph showing the temperature dependence of the current efficiency of each of a light-emitting element and a monitoring element.

FIG. 5 is a graph showing the temperature dependence of the current characteristic of each of the light-emitting element and the monitoring element. In FIG. 5, the horizontal axis represents the current density [mA/cm$^2$] and the vertical axis represents the current efficiency [cd/A].

As shown in FIG. 5, comparing current efficiencies shows that the monitoring element and the light-emitting element are hardly temperature dependent. The monitoring element exhibits an effect of the quenching material well and emits no light.

Temperature correction has been performed using an actual organic EL display on the basis of the fundamental data, followed by verification.

As a result, the voltages applied to light-emitting elements of a display section could be appropriately controlled by monitoring changes in I-V characteristic with changes in temperature. This allowed the organic EL display to emit light with constant luminance even though changes in temperature and variations in temperature were in the organic EL display. In this embodiment, R, G, and B monitoring elements are formed and therefore R, G, and B sub-pixels can be carefully controlled by monitoring changes in temperature and changes in I-V characteristic.

In particular, a TFT using an oxide semiconductor is characteristic of having a small off-current. Therefore, if the current is measured with the TFT using the oxide semiconductor, the current can be monitored with high accuracy.

On the other hand, in the display of the comparative example in which the light-emitting element was the same as the monitoring element, light leaked from a display section near the monitoring element. This is due to the fact that light emitted from the monitoring element leaked in the form of stray light. In light-emitting elements such as organic EL elements, though about 20% of emitted light can be radiated toward an upper or lower surface, the rest converts into light propagating in a device. If light is scattered by components in a display in the case of propagation, the scattered light leaks outside; hence, light unnecessary for display is detected. In the case where a monitoring element contains a quenching material as described in this embodiment, the monitoring element emits no light; hence, a display which has no light leaks and which is excellent in display quality can be achieved.

[Second Embodiment]

A second embodiment of the present invention is described below with reference to FIGS. 6A, 6B, and 7.

The basic configuration of an organic EL display according to this embodiment is substantially the same as that described in the first embodiment. A quenching material is different from that used in the first embodiment.

Figure 6A:
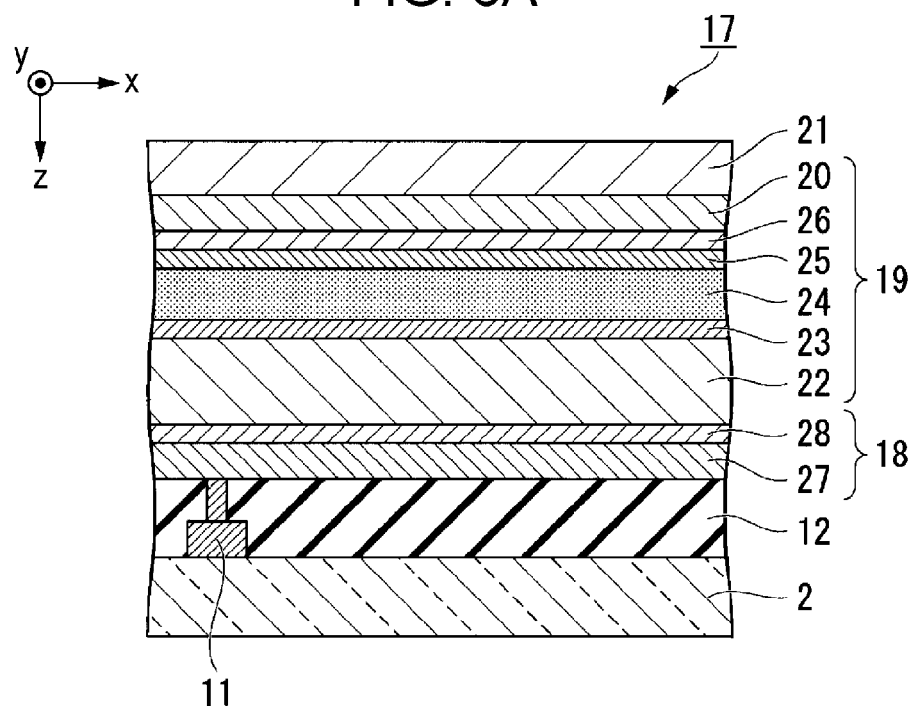
FIG. 6A is a sectional view showing a light-emitting element in an organic EL display according to a second embodiment of the present invention.

FIG. 6A is a sectional view showing a light-emitting element in the organic EL display according to the second embodiment. FIG. 6B is a sectional view showing a monitoring element.

Figure 6B:
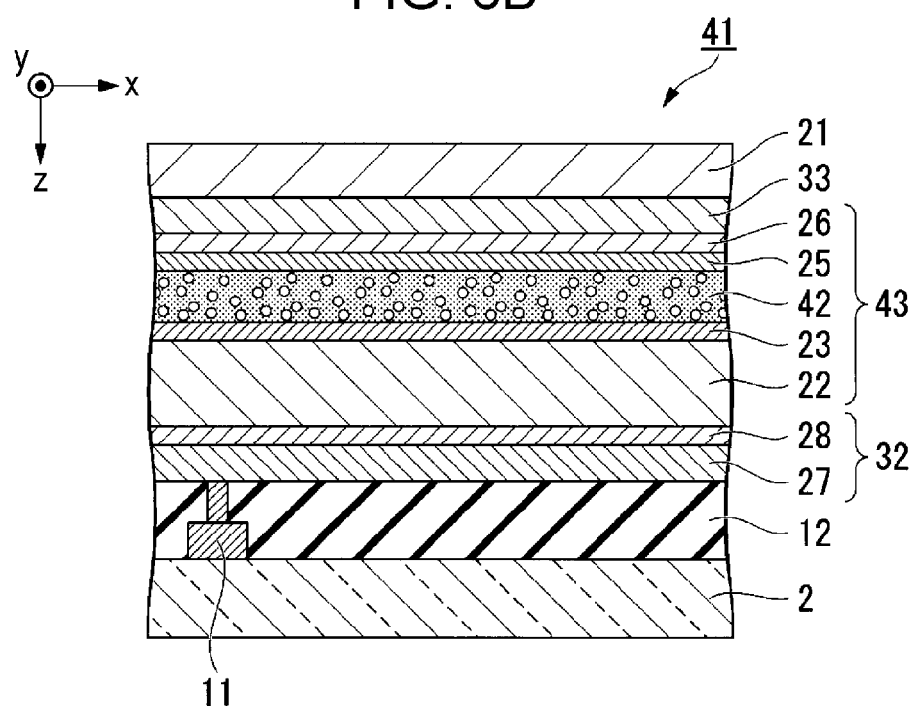
FIG. 6B is a sectional view showing a monitoring element.

In FIGS. 6A and 6B, components common to those shown in FIGS. 3A and 3B used in the first embodiment are given the same reference numerals and will not be described in detail.

In the first embodiment, a metal such as aluminium is used as the quenching material added to the light emission-suppressing layers of the monitoring elements. However, in the monitoring element 41 according to this embodiment, an organic absorber is used as a quenching material added to a light emission-suppressing layer 42 in an organic layer as shown in FIG. 6B. In the first embodiment, the phosphorescent material is used as the dopant material used in the red and green sub-pixels. However, in this embodiment, a fluorescent material is used as a dopant material used in red sub-pixels and green sub-pixels. A dopant material used in blue sub-pixels a fluorescent material in common with the first embodiment.

As shown in FIG. 6A, the configuration of the light-emitting element 17 is substantially the same as that described in the first embodiment.

Basically, the organic absorber preferably uses a dye capable of absorbing light in the emission wavelength range depending on the emission wavelength of a dopant material contained in each of R, G, and B light-emitting materials.

That is, the organic absorber preferably has an absorption wavelength range having at least one portion overlapping the emission wavelength range of each light-emitting material.

Figure 7:
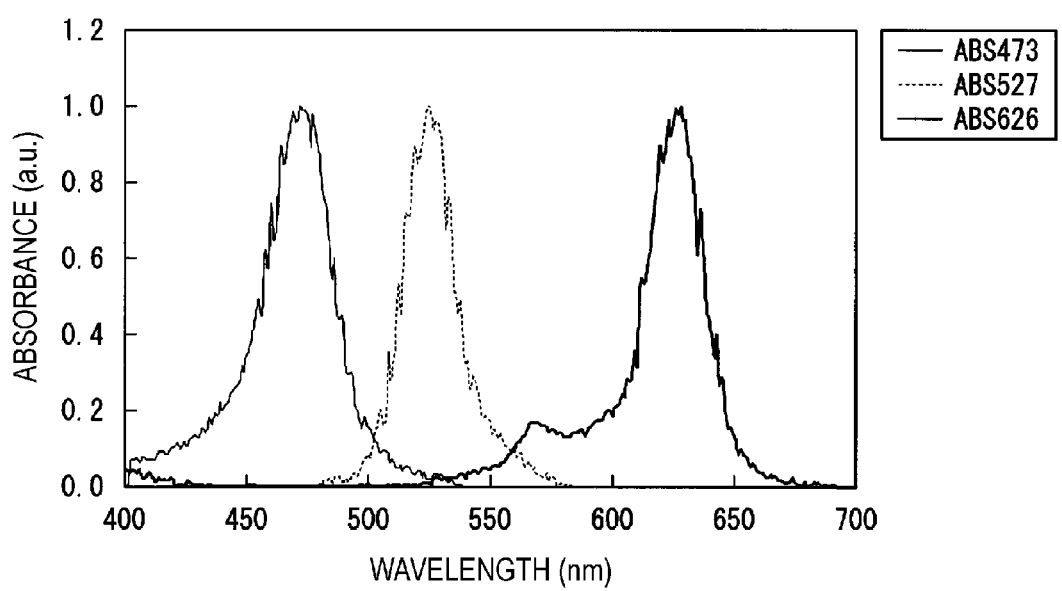
FIG. 7 is a graph showing the absorbance characteristics of organic absorbers used in monitoring elements.

FIG. 7 is a graph showing the absorption spectra of organic absorbers used in this embodiment.

In the graph, the horizontal axis represents the wavelength [nm] and the vertical axis represents the absorbance [arbitrary unit]. ABS473, ABS527, and ABS626 are commercially available dyes. As shown in FIG. 7, ABS473 has a peak wavelength at about 473 nm in the absorption spectrum, ABS527 has a peak wavelength at about 527 nm in the absorption spectrum, and ABS626 has a peak wavelength at about 626 nm in the absorption spectrum.

A detailed example of the configuration of the light emission-suppressing layer 42 is as shown in, for example, [Table 3].

TABLE 3

| | Red | Green | Blue |
|---|---|---|---|
| Light emission-suppressing layer | H (88%):d (9%) + ABS626 (3%) 60 nm | H (88%):d (9%) + ABS527 (3%) 60 nm | H (88%):d (9%) + ABS473 (3%) 35 nm |

For a material for the organic absorber, the matching of wavelengths is necessary. In order to prevent a component of light emitted from each light-emitting material from leaking outside, the light component needs to be confined in the organic absorber. In this regard, it is difficult to entirely absorb light, emitted from the dopant material in the light emission-suppressing layer 42, in the organic absorber mixed in the light-emitting material, which has a thickness of several tens of nanometers. Therefore, before light is emitted, energy is transferred from excitons to the organic absorber by exploiting an energy transfer phenomenon.

Energy transfer includes the Förster mechanism and the Dexter mechanism. Among the two energy transfer mechanisms, the Förster mechanism is a phenomenon that occurs between S1 levels when the emission wavelength of a light emitter and the emission wavelength of a light receiver match each other. In this regard, the concentration of molecules for receiving light can be set low because energy transfer occurs even if the distance between the molecules is about 20 nm. In this example, about 3% of the organic absorber is mixed with 88% of a host material and 9% of the dopant material. This enables energy excited by the dopant material to be entirely transferred to a dye, thereby enabling quenching. This configuration/phenomenon is a phenomenon that is characteristic of an organic material.

In this embodiment, the fluorescent material is used as a dopant and therefore the concentration of the organic absorber can be reduced. However, in the case of using a phosphorescent material, a similar configuration can be used. In this case, an energy transfer mechanism is not the Förster mechanism but is the Dexter mechanism. The Dexter mechanism is an electron exchange mechanism, so that molecules donating or receiving energy must be close to each other. Therefore, it is preferable that the concentration of the organic absorber is substantially equal to the concentration of the dopant at least.

A basic effect is substantially the same as that of the first embodiment. Though the quenching material is mixed, the I-V characteristic at room temperature and the I-V characteristic at the change of temperature varied very little, which is not particularly shown. An effect of the quenching material was sufficiently reproduced and no emitted light leaked. This enables luminance to be appropriately corrected without adversely affecting display, thereby enabling a display with excellent display quality to be achieved.

In the configuration in this embodiment, the organic absorber is used as the quenching material as described in the description of the configuration. In particular, the concentration of the quenching material conduction band reduced by exploiting the energy transfer phenomenon. Therefore, the change of the I-V characteristic or temperature characteristic due to the presence or absence of the quenching material can be minimized.

[Third Embodiment]

A third embodiment of the present invention is described below with reference to FIGS. 8A and 8B.

The basic configuration of an organic EL display according to this embodiment is substantially the same as that described in the first embodiment. This embodiment is different from the first embodiment in that an infrared light-emitting material is used instead of a quenching material.

Figure 8A:
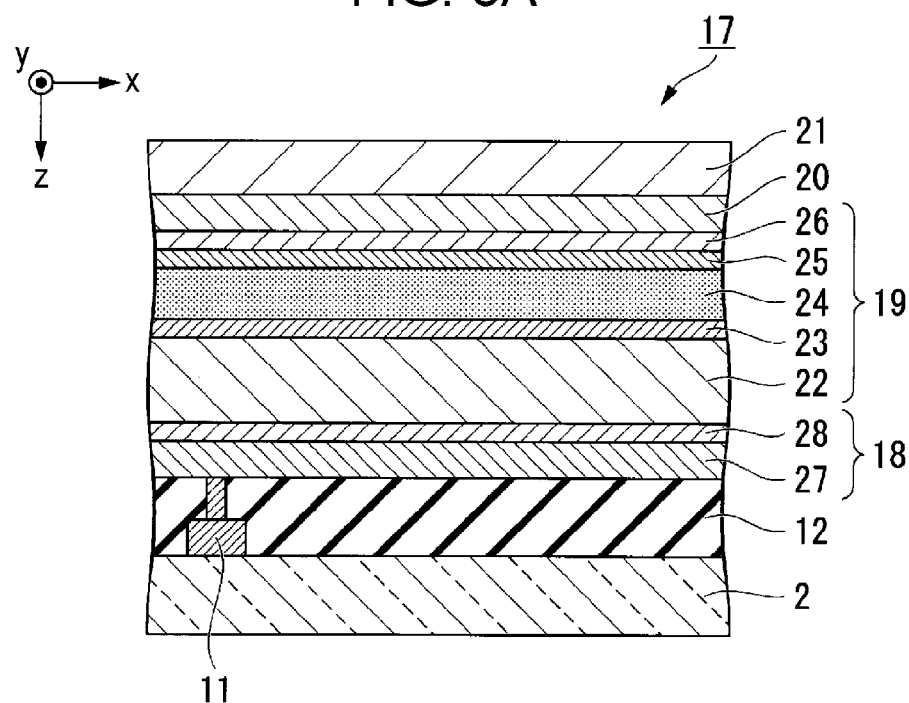
FIG. 8A is a sectional view showing a light-emitting element in an organic EL display according to a third embodiment of the present invention.

FIG. 8A is a sectional view showing a light-emitting element in the organic EL display according to the third embodiment. FIG. 8B is a sectional view showing a monitoring element.

Figure 8B:
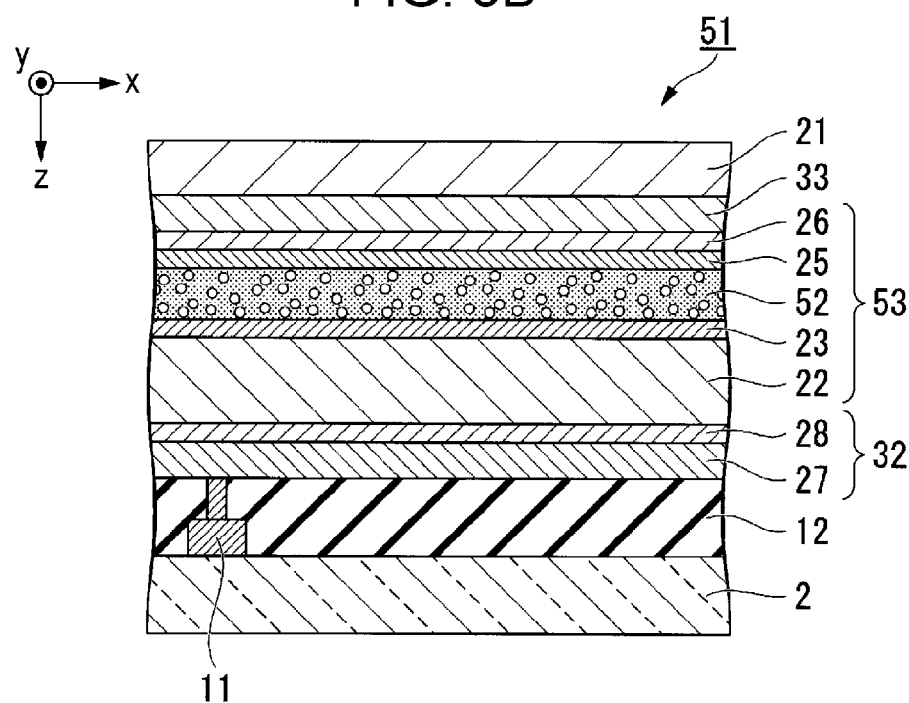
FIG. 8B is a sectional view showing a monitoring element.

In FIGS. 8A and 8B, components common to those shown in FIGS. 3A and 3B used in the first embodiment are given the same reference numerals and will not be described in detail.

In the first and second embodiments, the quenching material, such as metal of the organic absorber, is added to the light emission-suppressing layer of each monitoring element. However, in the monitoring element 51 in this embodiment, an invisible light-emitting material having at least one emission peak wavelength in an invisible range, that is, for example, an infrared light-emitting material having an emission peak wavelength in the infrared range is added to a light emission-suppressing layer 52 in an organic layer 53 as shown in FIG. 8B. Herein, Bisanthene-TIPS which is a near-infrared light-emitting material is used as an example of the infrared light-emitting material. The emission peak wavelength of this material is preferably in a wavelength range of more than 780 nm and is, for example, 800 nm. The size of the monitoring element 51 is twice the size of each monitoring element 15 in the first embodiment. As shown in FIG. 8A, the configuration of the light-emitting element 17 is substantially the same as that described in the first embodiment.

A detailed example of the configuration of the light emission-suppressing layer 52 is as shown in, for example, [Table 4].

TABLE 4

|  | Red | Green | Blue |
| --- | --- | --- | --- |
| Light emission-suppressing layer | H (88%):d (9%) + near-infrared dye (3%) 60 nm | H (88%):d (9%) + near-infrared dye (3%) 60 nm | H (88%):d (9%) + near-infrared dye (3%) 35 nm |

A basic effect is substantially the same as that of the first embodiment. Though the infrared light-emitting material is mixed, the I-V characteristic at room temperature and the I-V characteristic at the change of temperature varied very little, which is not particularly shown. Although the infrared light-emitting material is supposed to emit light, light emission could not be visually observed. This enables luminance to be appropriately corrected without adversely affecting display, thereby enabling a display with excellent display quality to be achieved.

This embodiment is characterized in that a light-emitting material emitting invisible light is used in the light emission-suppressing layer 52. In the first and second embodiments, the quenching material is mixed with the light-emitting material for the purpose of using the monitoring elements as non-light-emitting elements. However, the quenching material converts excitation energy generated in the dopant into heat. In the first and second embodiments, the size and heat dissipation structure of the monitoring elements are devised such that no adverse influences are caused. However, when heat dissipation is difficult depending on the size and structure of the monitoring elements, it is conceivable that accurate monitoring cannot be performed due to heat generated from the monitoring elements. In this case, using the light-emitting material emitting light in an invisible wavelength range as described in this embodiment reduces the amount of heat generated from the monitoring element 51, thereby enabling accurate monitoring to be performed.

[Fourth Embodiment]

A fourth embodiment of the present invention is described below with reference to FIGS. 9A and 9B.

The basic configuration of an organic EL display according to this embodiment is substantially the same as that described in the first embodiment. This embodiment is different from the first embodiment in that a quenching layer is separately formed.

Figure 9A:
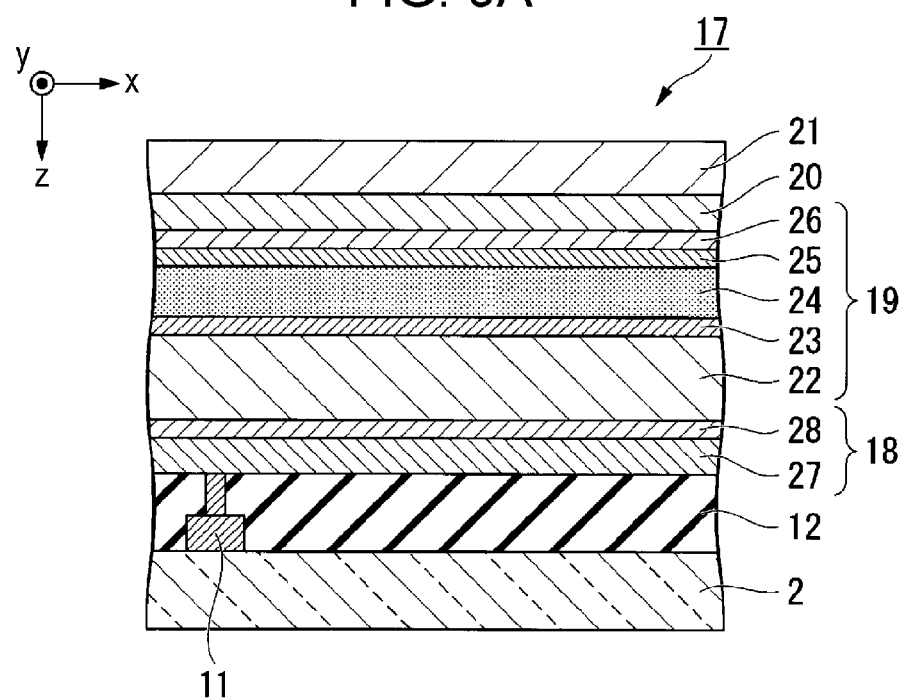
FIG. 9A is a sectional view showing a light-emitting element in an organic EL display according to a fourth embodiment of the present invention.
Figure 9B:
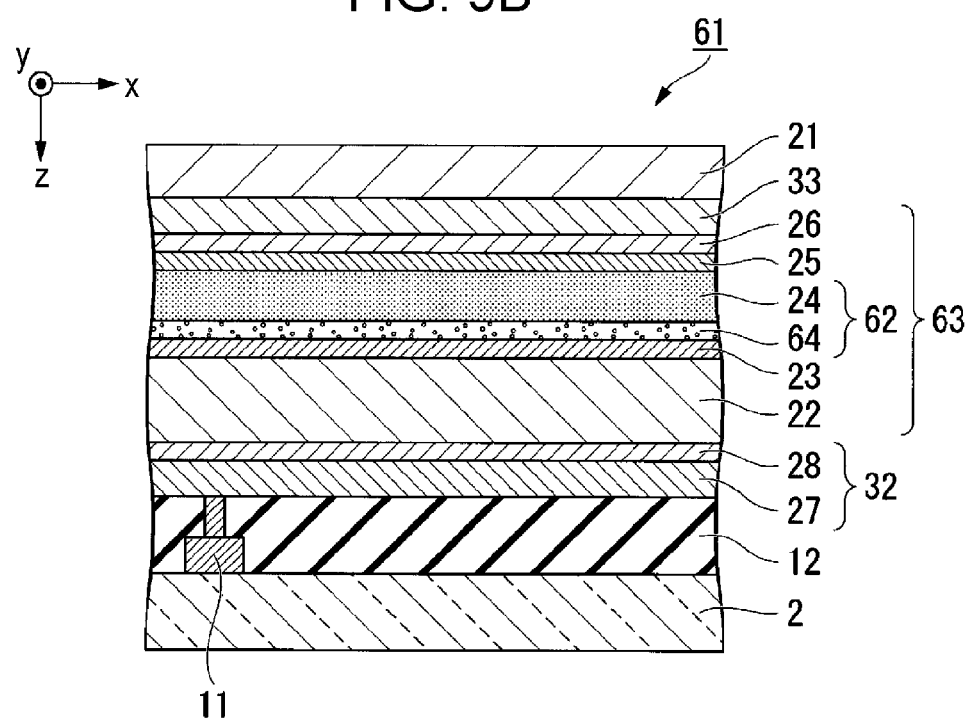
FIG. 9B is a sectional view showing a monitoring element.

In FIGS. 9A and 9B, components common to those shown in FIGS. 3A and 3B used in the first embodiment are given the same reference numerals and will not be described in detail.

In the first and second embodiments, the quenching material is added to the light-emitting material making up the light emission-suppressing layer of each monitoring element. However, in the monitoring element 61 in this embodiment, a light emission-suppressing layer 62 in an organic layer 63 has a two-layer structure including a light-emitting layer 24 containing an organic light-emitting material and a quenching layer 64 containing a quenching material as shown in FIG. 9B. The quenching layer 64 can be formed by the co-deposition of a hole transport material and the quenching material.

The quenching material used may be either of such a metal as described in the first embodiment and such an organic absorber as described in the second embodiment. The thickness of the quenching layer 64 is, for example, 1 nm. The quenching layer 64 is interposed between a hole transport layer 23 and the light-emitting layer 24.

In the case of this embodiment, the quenching layer 64, which contains the hole transport material, is interposed and therefore the thickness of the hole transport layer 23 is preferably less than that described in the first embodiment and is, for example, 8 nm. The configuration of the light-emitting layer 24 is different from that of the light-emitting layer of each light-emitting element in the first embodiment in that an electron transport material is used as a host material instead of the bipolar material. For monitoring elements 61 corresponding to red and green sub-pixels, an assist material is added to a host material and a dopant material. The assist material has a function of supplementing the carrier transportability of the host material to promote the injection and migration of carriers into the light-emitting layer. The above configuration allows a light-emitting position in the light-emitting layer 24 to move from the center of the light-emitting layer 24 to an interface close to the hole transport layer 23, that is, the vicinity of the interface between the light-emitting layer 24 and the quenching layer 64.

A detailed example of the configuration of the monitoring element 61 is as shown in, for example, [Table 5].

TABLE 5

|  | Red | Green | Blue |
| --- | --- | --- | --- |
| Hole transport layer | Organic HTL material 8 nm | Organic HTL material 8 nm | Organic HTL material 8 nm |
| Quenching layer | HTL material 50%:quenching material 50% 1 nm | HTL material 50%:quenching material 50% 1 nm | HTL material 50%:quenching material 50% 1 nm |
| Light-emitting layer | H (90%):A (7%):d (3%) 60 nm H:electron transport A:bipolar d:phosphorescent material Light-emitting position:HTL interface | H (90%):A (7%):d (3%) 60 nm H:electron transport A bipolar d:phosphorescent material Light-emitting position:HTL interface | H (90%):d (10%) 35 nm H:electron transport d:phosphorescent material Light-emitting position:HTL interface |
| Electron transport layer | Organic ETL material 15 nm | Organic ETL material 15 nm | Organic ETL material 15 nm |

EML H (host material), A (assist material), d (dopant material)

FIG. 9A is a sectional view showing a light-emitting element in the organic EL display according to the fourth embodiment. FIG. 9B is a sectional view showing a monitoring element.

As shown in FIG. 8A, the cross-sectional structure of the light-emitting element 17 is substantially the same as that described in the first embodiment. However, unlike the first embodiment, constituent materials of the light-emitting layer 24 are matched to the light-emitting layer 24 of the above-mentioned monitoring element 61.

A detailed example of the configuration of the light-emitting layer 24 in the light-emitting element 17 is as shown in, for example, [Table 6].

TABLE 6

|  | Red sub-pixel | Green sub-pixel | Blue |
|---|---|---|---|
| Light-emitting layer | H (90%):A (7%):d (3%) 60 nm<br>H:electron transport<br>A:bipolar<br>d:phosphorescent material<br>Light-emitting position:HTL interface | H (90%):A (7%):d (3%) 60 nm<br>H:electron transport<br>A:bipolar<br>d:phosphorescent material<br>Light-emitting position:HTL interface | H (90%):d (10%) 35 nm<br>H:electron transport<br>d:phosphorescent material<br>Light-emitting position:HTL interface |

This embodiment is characterized in that the light emission-suppressing layer 62, which has the two-layer structure consisting of the light-emitting layer 24 and the quenching layer 64, is used. In other words, it is characteristic that the quenching layer 64 is placed between the light-emitting layer 24 and the hole transport layer 23. A light-emitting spot in the light-emitting layer 24 is moved to the vicinity of the interface between the light-emitting layer 24 and the hole transport layer 23 by varying a charge transfer balance in the light-emitting layer 24. The above configuration allows excitons generated by the application of an electric field to be concentrated at an interface on the hole transport layer 23 side; hence, the excitons are quenched by the quenching layer 64, which is placed at an interface, without emitting light.

In this embodiment, the assist material is added to the light-emitting material, which makes up the light-emitting layer 24. In this embodiment, the dopant material used is a phosphorescent material. Most of host materials used are less resistant to a specific charge than the phosphorescent material, leading to a reduction in element life. Therefore, for charge resistance, the assist material is added, whereby the element life can be significantly extended. In the first and second embodiments, the assist material can be used. Then, the vapor deposition of a light-emitting element is quaternary deposition; hence, it is difficult to ensure the control of film thickness or the uniformity of film thickness. In general, binary or ternary deposition is a limit. Therefore, in this embodiment, the quenching layer 64 is separately placed, thereby allowing the light-emitting layer 24 to have an optimum configuration.

The thickness of the quenching layer 64 is preferably minimized and is preferably, for example, 1 nm or less. The quenching layer 64 may be made of the quenching material. In order to equalize the transfer of a charge (I-V characteristic) to the light-emitting element 17, the quenching material may be mixed with a material used in the light-emitting layer 24 or the hole transport layer 23.

In this embodiment, the quenching layer 64 is placed between the light-emitting layer 24 and the hole transport layer 23. The quenching layer 64 may be placed between the light-emitting layer 24 and the electron transport layer 25. In this case, the host material in the light-emitting layer 24 may be a hole transport one.

A basic effect is substantially the same as that of the first embodiment. According to this embodiment, luminance can be appropriately corrected without adversely affecting display, thereby enabling a display with excellent display quality to be achieved. A further effect of this embodiment is that the life of light-emitting elements in a display section is extended. Adding the assist material to the red and green sub-pixels allows the half-decay lifetime to be twice or more the first embodiment.

[Fifth Embodiment]

A fifth embodiment of the present invention is described below with reference to FIG. 10.

The basic configuration of an organic EL display according to this embodiment is substantially the same as that described in the first embodiment. This embodiment is different in the position of a monitoring element from the first embodiment.

Figure 10:
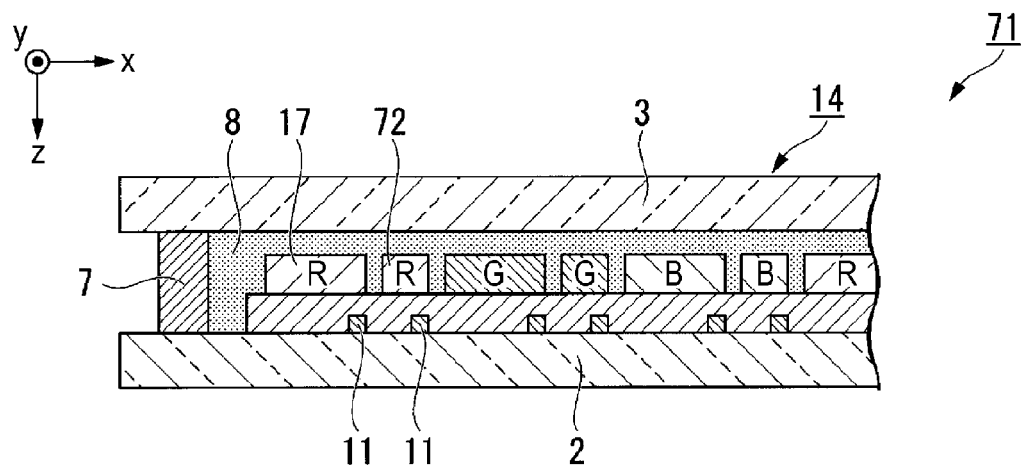
FIG. 10 is a sectional view showing an organic EL display according to a fifth embodiment of the present invention.

FIG. 10 is a sectional view showing the organic EL display according to the fifth embodiment.

In FIG. 10, components common to those shown in FIG. 2 used in the first embodiment are given the same reference numerals and will not be described in detail.

In the first embodiment, the monitoring elements are placed outside the display section. However, in the organic EL display 71 according to this embodiment, monitoring elements 72 are placed in a display section 14 as shown in FIG. 10. Each of the monitoring elements 72 is placed in a position adjacent to a light-emitting element 17 of a corresponding one of sub-pixels. The monitoring elements 72 are connected to TFTs 11 for controlling the individual monitoring elements 72. Each of the monitoring elements 72 is placed with respect to a corresponding one of the sub-pixels. The number of the monitoring elements 72 is not particularly limited. When the number of the monitoring elements 72 is large, the luminance can be accurately controlled with respect to changes in temperature.

A basic effect is substantially the same as that of the first embodiment. According to this embodiment, the luminance can be appropriately corrected without adversely affecting display, thereby enabling a display with excellent display quality to be achieved. In particular, in this embodiment, since the monitoring elements 72 are placed in the display section 14, the luminance can be accurately controlled. When, for example, the organic EL display 71 is directly illuminated with sunlight and therefore is partly heated or after a portion of the organic EL display 1 is touched by a person and is thereby heated, the luminance of each site where temperature change occurs can be controlled. Therefore, uniform display can be performed.

The technical scope of the present invention is not limited to the above embodiments. Various modifications can be made without departing from the gist of the present invention.

For example, in the first and second embodiments, an example in which the light-emitting material is laced with the quenching material such that no light is emitted. However, a small amount of light may leak because quenching cannot be completely achieved. Even in this case, if visible light is emitted with a luminance lower than that of a light-emitting element when the same voltage as that applied to a monitoring element is applied to the light-emitting element, an effect of the embodiment of the invention can be obtained. The detailed configuration of each portion of an organic EL display is not limited to the above embodiments and may be appropriately modified. The present invention is applicable to self-luminous displays other than organic EL displays.

INDUSTRIAL APPLICABILITY

An embodiment of the present invention is applicable to various displays such as organic EL displays.

REFERENCE SIGNS LIST 1, 71 Organic EL display (display)
2 Element substrate (base member)
9 Controlling semiconductor element (control section)
14 Display section
15, 41, 51, 61 Monitoring elements (detection elements)
17 Light-emitting elements
18 Anode (light-emitting element first electrode)
20 Cathode (light-emitting element second electrode)
24 Light-emitting layers
30, 42, 52, 62 Light emission-suppressing layers
32 Anode (detection element first electrode)
33 Cathode (detection element second electrode)
P Pixels

The invention claimed is:

1. A display comprising:
a base member;
a display section, attached to the base member, including a plurality of pixels, each pixel including a plurality of light-emitting elements;
detection elements, attached to the base member, that detect a temperature of the light-emitting elements; and
a control section that controls voltages supplied to the light-emitting elements on the basis of results detected by the detection elements, wherein
the light-emitting elements each include a light-emitting element first electrode, a light-emitting element second electrode, and a light-emitting layer between the light-emitting element first electrode and the light-emitting element second electrode,
the detection elements each include a detection element first electrode, a detection element second electrode, and a light emission-suppressing layer containing a same light-emitting material as the light-emitting layer, the light emission-suppressing layer being located between the detection element first electrode and the detection element second electrode,
when voltages are supplied to the detection elements, the light emission-suppressing layers do not emit any visible light or emit visible light with a luminance lower than a case where the voltages are applied to the light-emitting elements, and
the light emission-suppressing layers contain an organic light-emitting material emitting visible light and a quenching material.

2. The display according to claim 1, wherein the light emission-suppressing layers have a single-layer structure containing a mixture of the organic light-emitting material and the quenching material.

3. The display according to claim 1, wherein the light emission-suppressing layers have a multilayer structure including a layer containing the organic light-emitting material and a layer containing the quenching material.

4. The display according to claim 1, wherein the quenching material includes a metal material.

5. The display according to claim 1, wherein the quenching material includes an organic material having an absorption wavelength range having at least one portion overlapping the emission wavelength range of the organic light-emitting material.

6. The display according to claim 1, wherein the detection elements are placed outside the display section.

7. The display according to claim 1, wherein each of the pixels in the display section is provided with a corresponding one of the detection elements.

8. The display according to claim 1, wherein a size of the detection elements is less than a size of the light-emitting elements.

9. The display according to claim 1, wherein
each of the pixels includes a plurality of sub-pixels emitting light of different colors, and
the detection elements are each composed of a plurality of detection elements corresponding to the different colors.

10. The display according to claim 1, wherein
the pixels are provided with thin-film transistors, and
the thin-film transistors each include a semiconductor layer made of an oxide semiconductor.

11. A display comprising:
a base member;
a display section, attached to the base member, including a plurality of pixels, each pixel including a plurality of light-emitting elements; and
detection elements, attached to the base member, that detect a temperature of the light-emitting elements, wherein
the light-emitting elements each include a light-emitting element first electrode, a light-emitting element second electrode, and a light-emitting layer between the light-emitting element first electrode and the light-emitting element second electrode,
the detection elements each include a detection element first electrode, a detection element second electrode, and a light emission-suppressing layer containing a same light-emitting material as the light-emitting layer, the light emission-suppressing layer being located between the detection element first electrode and the detection element second electrode,
when voltages are supplied to the detection elements, the light emission-suppressing layers do not emit any visible light or emit visible light with a luminance lower than a case where the voltages are applied to the light-emitting elements, and
the light emission-suppressing layers include an organic light-emitting material emitting visible light and an invisible light-emitting material having at least one emission peak wavelength in an invisible range.

12. The display according to claim 11, wherein the invisible range is a wavelength range of more than 780 nm.

13. The display according to claim 11, wherein the detection elements are outside the display section.

14. The display according to claim 11, wherein each of the pixels in the display section includes a corresponding one of the detection elements.

15. The display according to claim 11, wherein a size of the detection elements is less than a size of the light-emitting elements.

16. The display according to claim 11, wherein
each of the pixels includes a plurality of sub-pixels emitting light of different colors, and
the detection elements each include a plurality of detection elements corresponding to the different colors.

17. The display according to claim 11, wherein
the pixels include thin-film transistors, and
the thin-film transistors each include a semiconductor layer of an oxide semiconductor material.

\* \* \* \* \*